United States Patent
Wickersham, Jr. et al.

(10) Patent No.: US 7,712,514 B2
(45) Date of Patent: May 11, 2010

(54) SPUTTER TARGETS AND METHODS OF MANUFACTURING SAME TO REDUCE PARTICULATE EMISSION DURING SPUTTERING

(75) Inventors: Charles E. Wickersham, Jr., Columbus, OH (US); John E. Poole, Grove City, OH (US); Alexander Leybovich, Hilliard, OH (US); Lin Zhu, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 12/315,205

(22) Filed: Dec. 1, 2008

(65) Prior Publication Data

US 2009/0078391 A1    Mar. 26, 2009

Related U.S. Application Data

(60) Continuation of application No. 11/063,508, filed on Feb. 23, 2005, now abandoned, which is a division of application No. 10/018,406, filed as application No. PCT/US01/40473 on Apr. 9, 2001, now abandoned.

(60) Provisional application No. 60/197,790, filed on Apr. 14, 2000, provisional application No. 60/215,037, filed on Jun. 29, 2000, provisional application No. 60/249,978, filed on Nov. 20, 2000.

(51) Int. Cl.
*B22D 1/00* (2006.01)
(52) U.S. Cl. .................. 164/134; 164/55.1; 164/358
(58) Field of Classification Search ............ 164/134, 164/358, 55.1
See application file for complete search history.

(56) References Cited

U.S. PATENT DOCUMENTS

| | | | |
|---|---|---|---|
| 2,790,216 A | 4/1957 | Hunter | |
| 4,054,173 A | 10/1977 | Hickam | |
| 4,474,225 A | 10/1984 | Yu | |
| 4,568,007 A | 2/1986 | Fishler | |
| 4,740,481 A | 4/1988 | Wilson et al. | |

(Continued)

FOREIGN PATENT DOCUMENTS

EP    0 327 226 B1 *    8/1991

(Continued)

OTHER PUBLICATIONS

Freitag, W.O. et al., "Diode Sputtering of Cerment Films," 2nd Symposium on the Deposition of Thin Films by Sputtering, University of Rochester and Consolidated Vacuum Corporation, Rochester, NY, Jun. 1967, pp. 92-96.

(Continued)

*Primary Examiner*—Kevin P Kerns
(74) *Attorney, Agent, or Firm*—Wegman, Hessler & Vanderburg

(57) ABSTRACT

Methods for reducing inclusion content of sputter targets and targets so produced are disclosed. Inclusions may be reduced by adding a small amount of Si to the molten Al or molten Al alloy followed by filtering of the molten metals through a filter medium. Targets having substantially no inclusions therein of greater than about 400 μm are especially useful in the sputtering of large flat panel displays and result, upon sputtering, in a reduction in the amount of macroparticles sputtered onto the substrate.

5 Claims, 6 Drawing Sheets

U.S. PATENT DOCUMENTS

| | | | |
|---|---|---|---|
| 5,160,388 | A | 11/1992 | Legresy et al. |
| 5,369,063 | A | 11/1994 | Gee et al. |
| 5,406,850 | A | 4/1995 | Bouchard et al. |
| 5,559,614 | A | 9/1996 | Urbish et al. |
| 5,636,681 | A | 6/1997 | Sulzer et al. |
| 5,738,767 | A | 4/1998 | Coad et al. |
| 5,827,409 | A | 10/1998 | Iwata et al. |
| 5,887,481 | A | 3/1999 | Leroy et al. |
| 5,943,559 | A | 8/1999 | Maeda |
| 5,955,673 | A | 9/1999 | Leroy et al. |
| 5,989,782 | A | 11/1999 | Nishiki et al. |
| 6,001,227 | A | 12/1999 | Pavate et al. |
| 6,017,779 | A | 1/2000 | Miyasaka |
| 6,019,657 | A | 2/2000 | Chakvorty et al. |
| 6,020,946 | A | 2/2000 | Callegari et al. |
| 6,057,557 | A | 5/2000 | Ichikawa |
| 6,139,701 | A | 10/2000 | Pavate et al. |
| 6,439,054 | B1 | 8/2002 | Gore et al. |
| 6,487,910 | B1 | 12/2002 | Leybovich |
| 6,713,391 | B2 | 3/2004 | Yi et al. |
| 6,725,522 | B1 | 4/2004 | Ivanov et al. |

FOREIGN PATENT DOCUMENTS

| | | |
|---|---|---|
| EP | 0 211 401 B1 | 5/1992 |
| EP | 0 418 846 B1 | 2/1995 |
| EP | 0 665 193 A2 | 8/1995 |
| EP | 0 467 659 B1 | 3/1996 |
| EP | 0 412 843 B1 | 5/1996 |
| EP | 0 561 161 B1 | 4/1997 |
| EP | 0 853 136 B1 * | 7/1998 |
| EP | 0 853 136 B1 | 2/2003 |
| JP | 9-25564 | 1/1997 |
| JP | 10-323747 A | 12/1998 |
| KR | 1996-0007624 | 6/1996 |
| KR | 1999-0044398 | 6/1999 |
| WO | WO 97/30348 | 8/1997 |
| WO | WO 99/64854 | 12/1999 |
| WO | WO 00/15863 | 3/2000 |
| WO | WO 01/86282 A1 | 11/2001 |

OTHER PUBLICATIONS

Robinson, J.E. et al., "Models for Chunk Sputtering", Journal of Nuclear Materials, 1976, vol. 63, pp. 432-437, North-Holland Publishing Company.

Eernisse, E.P. et al., "Role of Integrated Lateral Stress in Surface Deformation of He-Implanted Surfaces," Journal of Applied Physics, Jan. 1, 1977, vol. 48, No. 1, pp. 9-17, American Institute of Physics.

Roth, R.M. et al., "Spatial Dependence of Particle Light Scattering in an RF Silane Discharge," Appl. Phys. Letter, Feb. 1, 1985, vol. 46, No. 3, pp. 253-255, American Institute of Physics.

Wehner, G.K., "Cone Formation as a Result of Whisker Growth on Ion Bombarded Metal Surfaces," J. Vac. Sci. Technol., Jul./Aug. 1985, A 3 (4), pp. 1821-1835, American Vacuum Society.

Spears, K.G. et al., "Particle Distributions and Laser-Particle Interactions in an RF Discharge of Silane," IEEE Transactions on Plasma Science, Apr. 1986, vol. PS-14, No. 2, pp. 179-187, IEEE.

Selwyn, G.S. et al., "In Situ Laser Diagnostic Studies of Plasma-Generated Particulate Contamination," J. Vac. Sci. Technol., Jul./Aug. 1989, A 7, (4) pp. 2758-2765, American Vacuum Society.

Anderson, H.M. et al., "Particulate Generation in Silane / Ammonia RF Discharges," J. Applied Physics, May 1, 1990, vol. 67, No. 9, pp. 3999-4011, American Institute of Physics.

Jellum, G.M., et al., "Particulates in Aluminum Sputtering Discharges," J. Appl. Phys., May 15, 1990, vol. 67, No. 10, pp. 6490-6496, American Institute of Physics.

Selwyn, G.S. et al., "In situ Plasma Contamination Measurements by HeNe Laser Light Scattering: A Case Study," J. Vac. Sci. Technol., May/Jun. 1990, A 8, (3) pp. 1726-1731, American Vacuum Society.

Selwyn, G.S. et al., "Particle Trapping Phenomena in Radio Frequency Plasmas," Appl. Phys. Letter, Oct. 29, 1990, vol. 57, No. 18, pp. 1876-1878, American Institute of Physics.

Akari, K. et al., "Reduction in Macroparticles During the Deposition of TiN Films Prepared by Arc Ion Plating," Surface and Coatings Technology, 1990, 43/44, pp. 312-323, Elsevier Sequoia, The Netherlands.

Barnes, M.S. et al., "Transport of Dust Particles in Glow-Discharge Plasmas," Physical Review Letters, Jan. 20, 1992, vol. 68, No. 3, pp. 313-316, The American Physical Society.

Smadi, M.M. et al., "Particle Contamination on a Silicon Substrate in a SF6 / Ar Plasma," J. Vac. Sci. Techol., Jan./Feb. 1992, B 10, (1) pp. 30-36, American Vacuum Society.

Yoo, W.J. et al., "Kinetics of Particle Generation in Sputtering and Reactive Ion Etching Plasmas," Appl. Phys. Letter, Mar. 2, 1992, vol. 60, No. 9, pp. 1073-1075, American Vacuum Society.

Logan, J.S. et al., "Study of Particle Emission in Vacuum from Film Deposits," J. Vac. Sci. Technol., Jul. /Aug. 1992, A 10, (4) pp. 1875-1878, American Vacuum Society.

Goree, J. et al., "Particulate Release from Surfaces Exposed to a Plasma," J. Vac. Sci. Technol., Nov./Dec. 1992, A 10, (6) pp. 3540-3544, American Vacuum Society.

Anderson, L., "A New Technique for Arc Control in DC Sputtering," Society of Vacuum Coaters, 35th Annual Technical Conference Proceedings, 1992, pp. 325-329.

Nadel, S.J. et al., "Enhanced Chromium First Surface Mirrors," Society of Vacuum Coaters, 35th Annual Technical Conference Proceedings, 1992, pp. 365-369.

Scholl, R.A., "A New Method of Handling Arcs and Reducing Particulates in DC Plasma Processing," Soicet of Vacuum Coaters, 37th Annual Technical Converence Proceedings, 1994, pp. 312-315, Advance Energy Industries, Inc.

Lee, F. et al., "Detecting and Reducing Particles for LPCVD Silicon Nitride Deposition," Microcontamination, Mar. 1994, vol. 12, pp. 33-37, 76-77.

Bailey, R.S. et al., Particle Emission from Al2O3 Doped Aluminum Targets during Sputtering Deposition, VMIC Conference, IS<OC, Jun. 7-8, 1994, p. 317.

Takahashi, K.M. et al., "Current Capabilities and Limitations of In Situ Particle Monitors in Silicon Processign Equipment," J. Vac. Sci. Technol., Nov. /Dec. 1996, A 14, (6) pp. 2983-2993, American Vacuum Society.

Selwyn, G.S. et al., "Particle Contamination Formation in Magnetron Sputtering Processes," J. Vac. Sci. Technol., Jul. /Aug. 1997, A 15 (4), pp. 2023-2028, American Vacuum Society.

Monteiro, O.R. et al., "Vacuum-Arc Generated Macroparticles in the Nanometer Range,," IEEE Transactions on Plasma Science, Aug. 1999, vol. 27, No. 4, p. 1030-1033, IEEE.

Abburi, M. et al., "Low-Defect Target Metallurgy Development for sub-0.18 μm Al-based Interconnects," Solid State Technology, Dec. 1999, vol. 42, pp. 55-58, Solid State Technology.

Danovich, D. et al., "Sputtering Issues for Flat-Panel Displays," Information Display, (Nov. 1995), pp. 26-27, 30-31.

Foster, H.I et al., "A Modular Approach to Sputter Coating of Flat Panel Displays," Society of Vacuum Coaters, 35th Annual Technical Conference (1992), pp. 357-361.

Von Güntherschulze, A., "Die Elecktronengeschwindigkeit in Isolatoren bei hohen Feldstärken und ihre Beziehung zur Theorie des elektrishen Durchschlages," Z Physik, Oct. 25, 1933, 86 pp. 778-786, Mitteilung aus dem Institut für Allgemeine Elektrotechnik der Technischen Hochshule, Dresden, Germany.

Leybovich, A. et al., TOSOH SMD, Inc.; Effect of Thin Film Oxide Inclusions on Aluminum Target Arcing and Particulate.; Presented 2nd National AVS Symposium, Minneapolis, MN, Oct. 16-20, 1995. Vacuum Metallurgy Division and Thin Film Division, American Vacuum Society; International Conference on Metallurgical Coatings and Thin Films, Programs and Abstracts; Apr. 22-26, 1996; 23 pages.

Nizhenko, V.I. et al., "Surface Tension of Melts . . . "; Adgezia Pacplavov I Paika Materialov 27.37 (1992).

Friedrichs, H.A. et al., "Measurement of Viscosity, Density and Surface Tension of Metal Melts", Steel Research, 68. 209-214 (1997).

* cited by examiner

SPUTTER TARGETS AND METHODS OF MANUFACTURING SAME TO REDUCE PARTICULATE EMISSION DURING SPUTTERING

CROSS-REFERENCE TO RELATED APPLICATIONS

This application is a continuation of application Ser. No. 11/063,508 filed Feb. 23, 2005, now abandoned, that was, in turn, a divisional of application Ser. No. 10/018,406 filed Dec. 13, 2001, now abandoned, which was a U.S. National Phase filing under 35 USC §365(c) of International PCT Application No. PCT/US01/40473 filed Apr. 9, 2001, which claimed the benefit of prior U.S. Provisional Patent Application Ser. Nos. 60/197,790 filed Apr. 14, 2000; 60/215,037 filed Jun. 29, 2000; and 60/249,978, filed Nov. 20, 2000.

FIELD OF INVENTION

The invention relates to sputter targets and methods of manufacture thereof that result in reduced particulate emission during sputtering.

BACKGROUND

Macroparticles are generated during sputtering by the presence of dielectric inclusions in the metallic sputter target. Electrical charges build up on the dielectric particle and eventually electrical breakdown occurs. When this electrical breakdown occurs a high current density cathodic arc forms and melts a small section of the target. The arc pressure causes the liquid metal in the cathode to spurt out at high velocity and strike the intended substrate. The droplets solidify on the substrate creating a large defect in the metallization layer.

This problem has been frequently experienced in the sputtering of large flat panel displays that commonly operate at power densities of greater than 16 W/cm$^2$. The appearance of macroparticles on these flat panel displays causes gaps or shorts in the metallization patterns required for addressing the various pixels in the display. Obviously, the gaps or shorts reduce the yield of acceptable display units.

Sputtered aluminum layers are often the initial conductive layer that is coated on the substrate. In addition to the desire in having low inclusion levels in the Al target, the targets must also provide good resistance to hillock formation. It is known that alloying additions of silicon and copper are effective at reducing hillock formation and that these alloying additions to aluminum do not significantly lower the electrical conductivity of the resulting sputtered Al films.

SUMMARY OF THE INVENTION

The invention centers around concurrent discoveries pertaining to (1) the size of macroparticles that are especially deleterious in high power sputtering operations such as those employed in flat panel display sputtering operations and (2) improvements in filtering deleterious inclusions from the molten Al during target formation by the addition of small amounts of Si to the alloying mix.

Initially, it was discovered that metallic sputtering target materials with inclusions below 500 µm in size would perform substantially free from macroparticle defect generation at sputtering power densities up to about 20 W/cm$^2$. Further, sputter targets with inclusions below 400 µm in size were found to perform substantially free of macroparticle generation at sputtering densities of about 25-30 W/cm$^2$. This is the sputtering power density range normally encountered in the sputtering of flat panel displays. At sputtering power densities of 40 W/cm$^2$ or greater, dielectric inclusions should be less than 300 µm in size in order to inhibit macroparticle contamination of the deposited film.

Further, during the casting process in which the molten metal, preferably Al, is cast into a sputter target. It has been found that addition of a small amount of Si into the molten metal improves the filtering performance of the ceramic filter element used in the semi-continuous casting method to thereby help to separate the undesirable inclusions from the molten mass before it is solidified.

After the sputter target with reduced inclusions has been prepared, it is tested to ascertain the amount and size of inclusions contained therein. When the target is adapted to sputter coat flat panel displays and the like wherein sputtering power densities of greater than about 25 W/cm$^2$ are commonly encountered, targets are rejected that contain measurable quantities of inclusions having sizes on the order of 400 µm and greater.

Two test methods are in common use today to detect size and quantity of defects in the metal. In the more prevalent ultrasonic method, the Al alloy ingot is immersed in a water tank while a 10 to 15 MHz ultrasonic transducer scans the part. The ultrasonic pulse is able to detect defects in the metal. An inclusion or void in the metal reflects the ultrasonic energy and is detected. Histograms, calibration charts and statistical calculations can be made using the reflected signals to determine the overall quality of the metal.

In the less common dissolution method, a small sample of the aluminum alloy is dissolved in acid and the acid solution is passed through a fine (typically 5 µm pore size) filter. The filter is then examined using optical and scanning electron microscopes to determine the number, composition and size distribution of inclusions in the metal sample.

The invention will be further described in the following detailed description which is to be read in conjunction with the appended drawings.

DETAILED DESCRIPTION OF EXEMPLARY EMBODIMENTS

Figure 1:
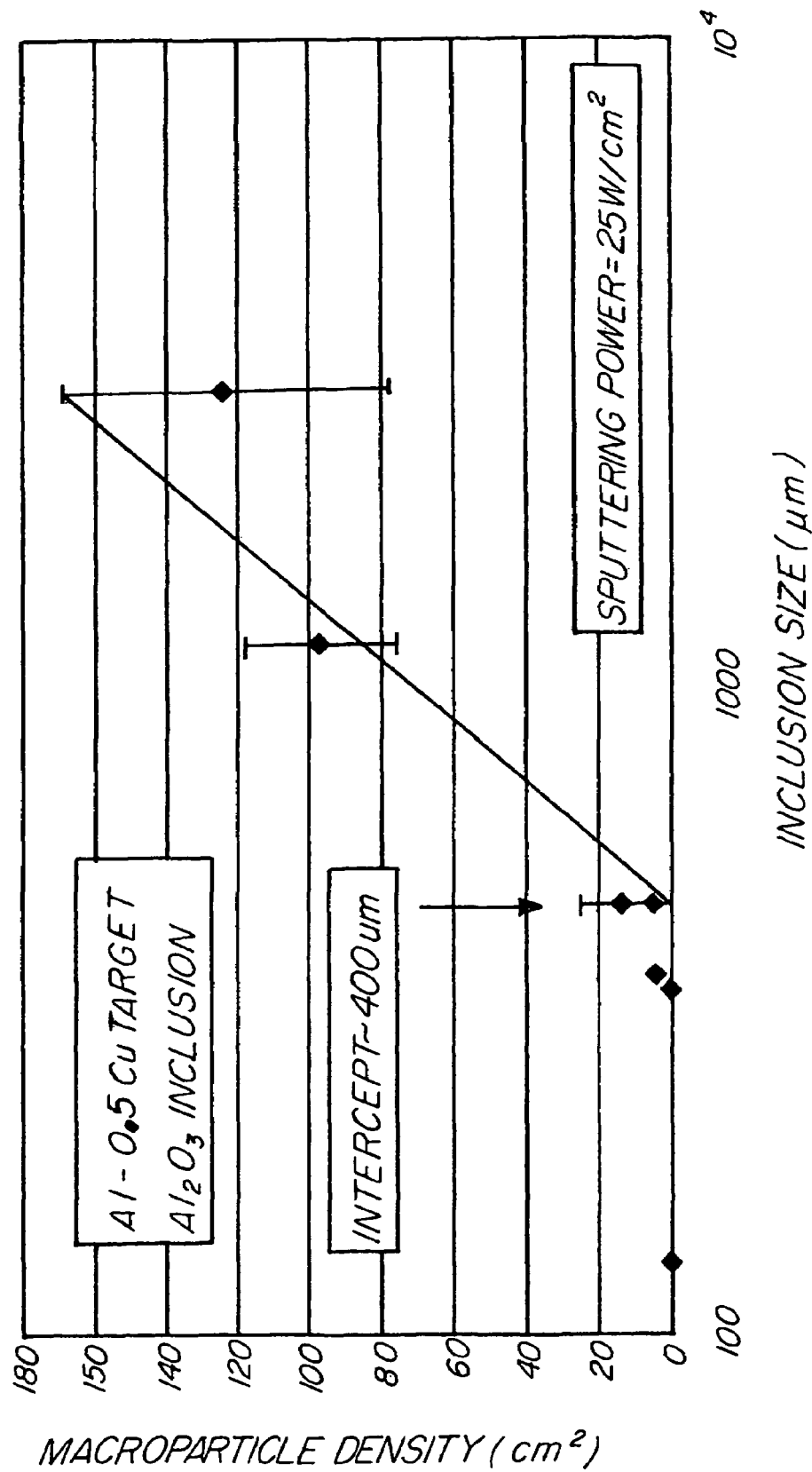
FIG. 1 is a graph showing the correlation between inclusion sizes and macroparticles sputtered from an Al 0.5 Cu target at a power density of 25 W/cm$^2$.

We have discovered that the cause of macroparticle generation during sputtering is the presence of relatively large dielectric inclusions in the metal sputtering target. Measurements of the relationship between inclusion size and macroparticle generation have shown that the generation of macroparticles depends upon the size of the inclusion. At a sputtering power of 25 W/cm², inclusions with size greater than around 400 μm are required to produce arcs of sufficient intensity to generate macroparticles. Inclusions with surface areas below this value can generate arcs, but the intensity of the arcs is not sufficient to melt the aluminum target spot and provide a large enough pressure wave to eject molten metal macroparticle droplets. Above this threshold inclusion surface area, the arcs have sufficient energy to melt a small spot on the target and eject molten metal droplets from the target. FIG. 1 shows how the number of molten metal macroparticle droplets increases with inclusion size in a test sputter system having a sputtering power density of 25 W/cm².

Accordingly, one way to reduce the number of macroparticles generated during aluminum target sputtering is to reduce the number of large dielectric inclusions contained in the metal target. In addition to low dielectric inclusion content, the target needs to provide an aluminum film on the substrate that has good electrical conductivity and good resistance to hillock formation. It is well known that alloying additions of silicon and copper are effective at reducing hillock formation and that these alloying additions to aluminum do not significantly lower the electrical conductivity of the sputtered aluminum films. However, it was not known until our work that the addition of silicon significantly reduces the dielectric inclusion density in aluminum alloys. This lower propensity to generate macroparticles is the result of alloying the aluminum target material with silicon. The silicon lowers the macroparticle generation by significantly improving the efficiency of aluminum filtering during sputtering target manufacture.

Figure 2:
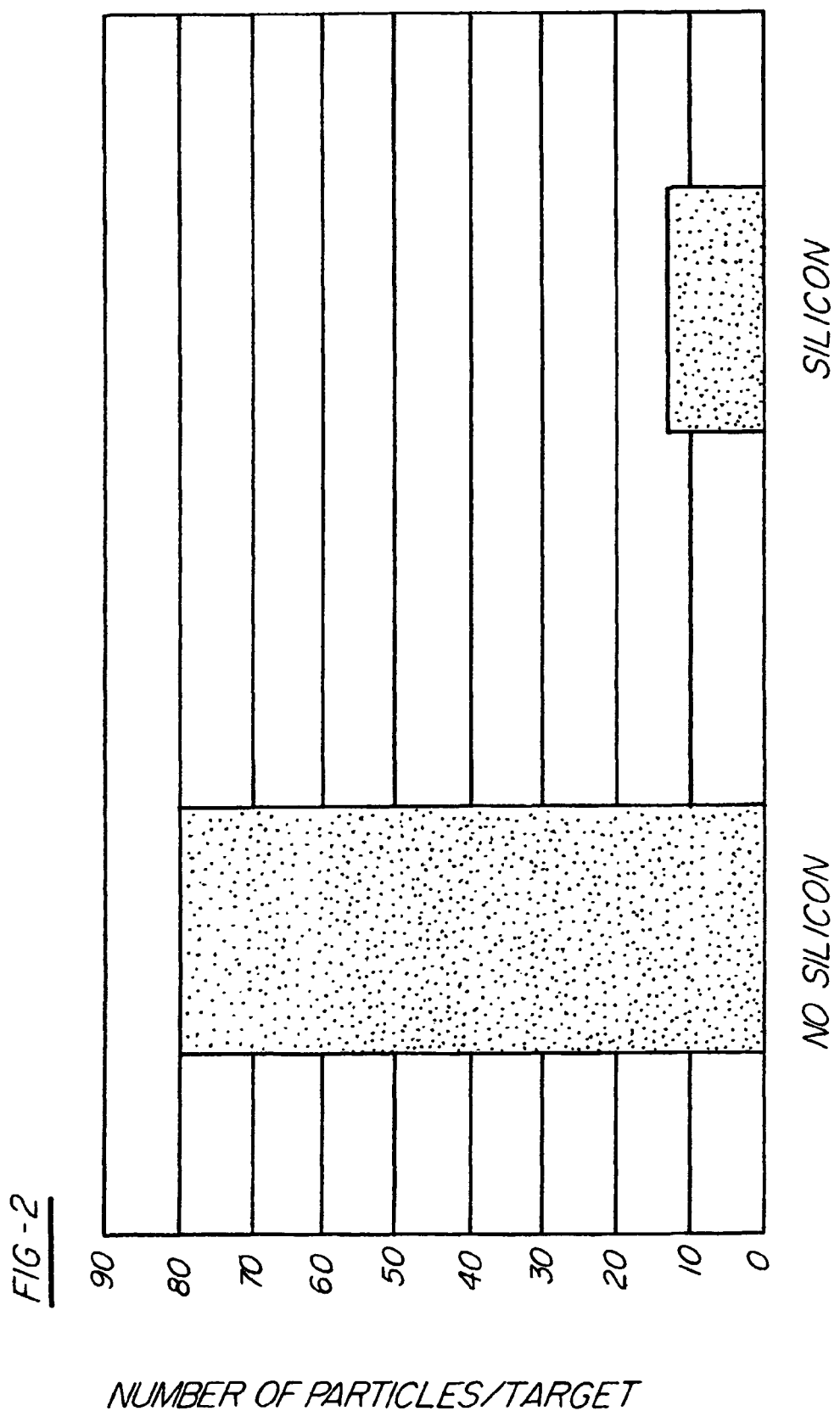
FIG. 2 is a graph showing the reduction in inclusions in targets wherein Si has been added as a filtering aid during the Al casting process.

One aspect of the invention relates to aluminum alloy sputtering targets that contain a small amount of silicon so that the hillock formation is reduced in the film while the electrical conductivity of the film is not significantly reduced from that of pure aluminum. Additionally, the propensity for macroparticle generation during sputtering is greatly reduced. FIG. 2 shows results of a series of measurements on sputtering targets manufactured with varying amounts of copper and silicon alloy additions. A significant reduction in dielectric inclusion concentration is found when silicon is added to the alloy. This result is unexpected. The explanation for this result is that the addition of silicon to the aluminum melt changes the aluminum alloy surface tension so that the aluminum metal efficiently wets the ceramic filter used to remove inclusions from the molten aluminum during casting. In this way the dielectric inclusion level in the cast metal is reduced and the generation of macroparticles from the target is eliminated.

Table 1 provides detailed inclusion measurements for various Al—Si—Cu alloys. It is clear from the data in Table 1 and FIG. 2 that the addition to the aluminum melt of ever small amounts of silicon (~0.2 wt % silicon) has a significant effect on lowering the number of dielectric inclusions in the aluminum. Adding copper to the melt appears to reduce the inclusion levels to a small extent, but silicon is significantly more effective.

TABLE 1

| Alloy (wt %) | Inclusion Count AVG | Inclusion Count STDEV |
| --- | --- | --- |
| Al—0.5Cu | 88 | 96 |
| Al—1Cu | 43 | 8 |
| Al—0.2Si—0.5Cu | 2 | 3 |
| Al—0.75Si—0.5Cu | 8 | 1 |
| Al—1Si—0.5Cu | 7 | 9 |
| Al—1Si—1Cu | 19 | 17 |
| Al—1Si | 28 | 9 |

Table 1. Inclusion counts in aluminum alloy sputtering targets.

Figure 3:
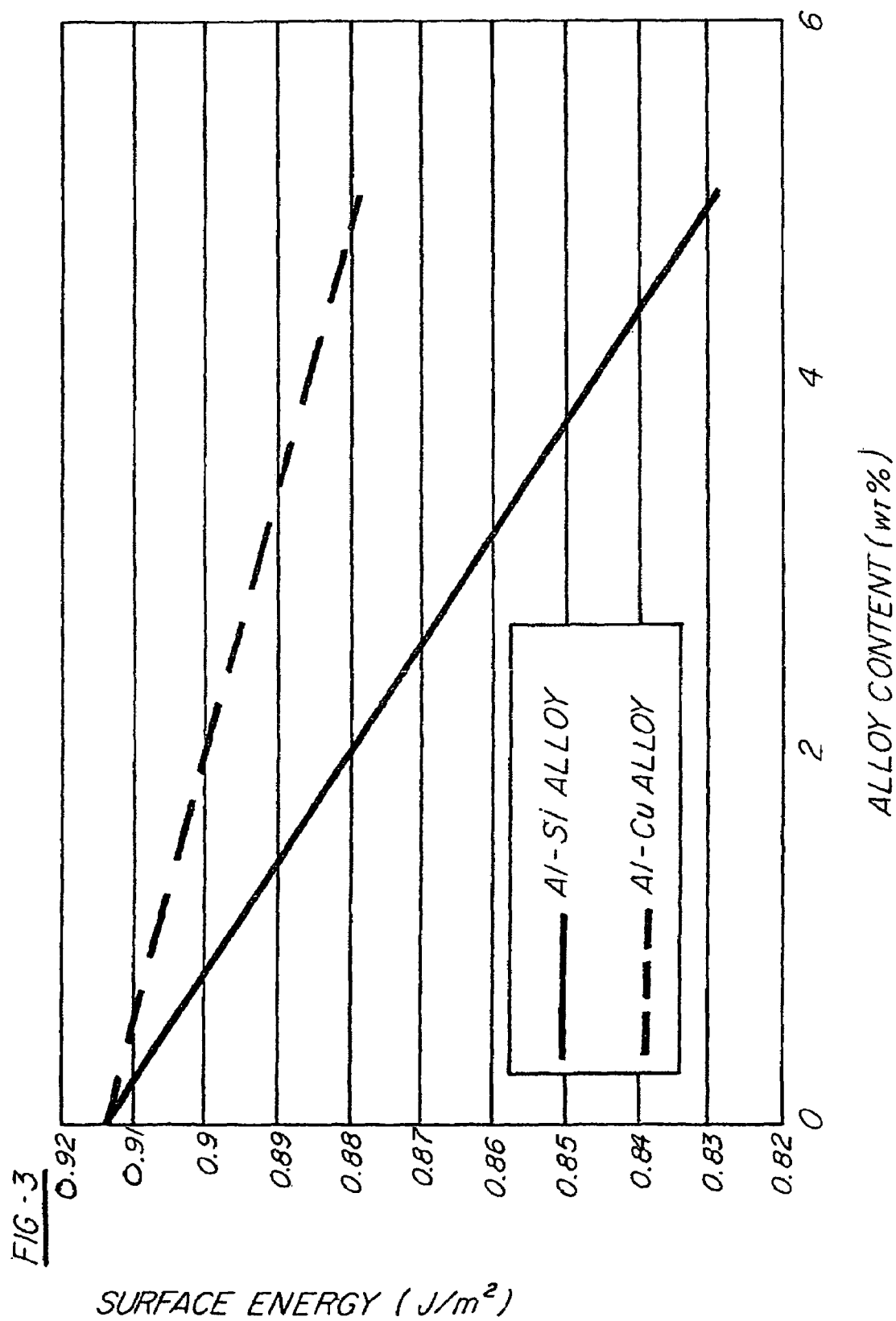
FIG. 3 is a graph comparing surface tension for Al—Si and Al—Cu melts.

The mechanism by which silicon reduces the dielectric inclusion level in the target is thought to be by significantly improving the effectiveness of the ceramic filter in removing dielectric inclusions from the melt during casting. FIG. 3 shows the surface tension for Al—Si and Al—Cu melts.

Since alloying additions usually reduce the electrical conductivity of metals, it is important to use as little alloying addition as is required to achieve desired characteristic. Consequently, the preferred alloy for this invention is Al-0.5Si-0.5Cu. The copper addition is useful for reducing hillock formation in the deposited film, while the silicon addition is useful for reducing dielectric inclusions in the aluminum alloy target. Copper may be added to the alloy in an amount of about 0.01-3.00 wt %.

In accordance with the process used in the invention to inhibit the amount of undesirable inclusion in sputter targets, high purity metal, such as aluminum or aluminum alloy is first melted. From about 0.01 to 2.00 wt % of Si is added to the melt.

Although applicants are not to be bound to any particular theory of operation, it is thought that addition of a small amount of Si into the melt decreases the surface tension of the melt so that the metal, such as Al, will wet the filter better. This, in turn, enhances the efficiency of the filter used in the casting system so that the inclusions better adhere to the filter during processing.

Figure 4:
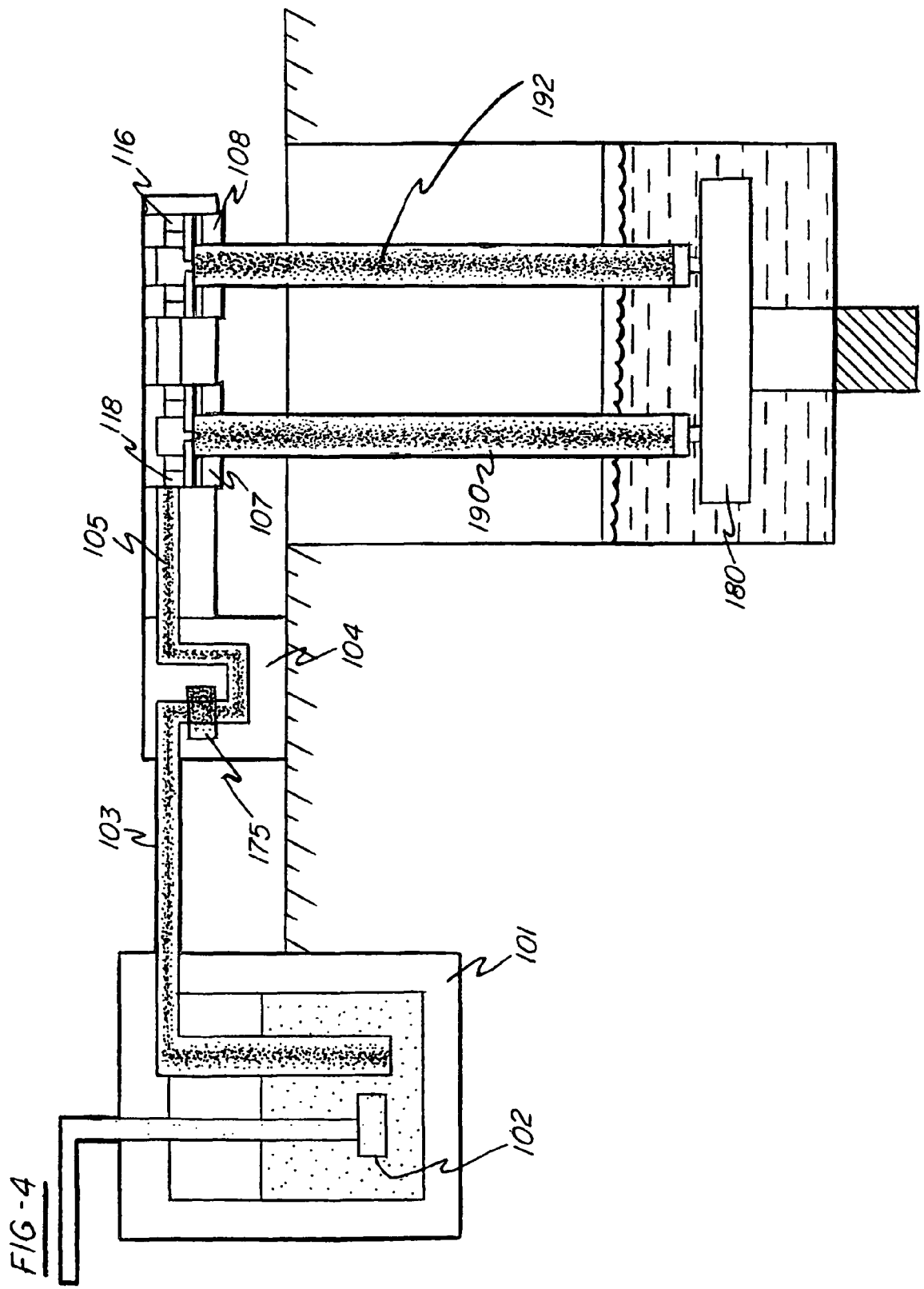
FIG. 4 is a schematic diagram of a semi-continuous casting process used to cast reduced inclusion containing Al targets in accordance with the invention.

Turning now to FIG. 4, the method for forming ingots of the desired metal, preferably Al and Al alloys, is schematically illustrated.

The metal, any alloying element, and Si are admitted to the induction melting furnace 101. The components are melted and degassed in injecting a sparging mixture of high purity argon and trace chlorine. The gas is injected thru a spinning nozzle 102 to shear the bas bubbles to very small size to provide greater surface area contact; thereby increasing the efficiency of the gas.

Degassing is performed for a period of time prior to casting. The dross is skimmed from the top and then the degassing is continued during the casting process. The degassing treatment helps to clean the metal of both dissolved gasses and suspended impurities. It also reduces unwanted alkali elements and Mg.

To initiate the cast, the induction furnace is pressurized using the sparging gas described above, with some additional argon. While closely monitoring metal and system temperatures, the metal is forced out of the furnace via a graphite pipe 103. This is a unique aspect of the invention in that it protects the metal from air contact and turbulence until it reaches the filter box.

The melt is then delivered to a preheated filter box 104 containing a sintered ceramic filter medium 175. Preferably, the filter is a sintered alumina filter of the type available from Mettaullics System Co., L.P., Solon, Ohio. The particular filter element presently preferred is an 8-grit porosity which equates to about 40-50 ppi (pores per linear inch).

Although the sintered alumina is presently preferred when Al metals and alloys are filtered, other ceramics such as Si, C, Ti, $B_2$, $B_4$, C, $SI_3$, $N_4$, SiAlON and zirconia can also be mentioned as exemplary filter components. Filters of the type that may be employed are described in U.S. Pat. No. 5,369,063, (Gee et al.), the disclosure of which is incorporated by reference therein.

Passage of the Si containing melt through the filter element removes a significant number of the inclusions that were not removed in the degassing process. After passing through the filter element, the metal is fed to a distribution trough 105 which evenly distributes and feeds metal to each of the water cooled ingot casting molds 107, 108. During feeding into the molds through the insulated hot top, the metal is vibrated (stirred) via low frequency inductive stirring coils 116, 118 to enhance the grain structure of the ingots.

The molten metal is fed and solidified at a controlled casting rate via contact with the water cooled molds (primary cooling) from which emerge the high quality solidified ingots 190, 192. The casting speed is controlled using computer-controlled hydraulic casting equipment 180. The ingot structure and surface quality are enhanced by advanced secondary cooling provided by the mold cooling water exiting the water-cooled mold and coming into direct contact with the solidified ingot as it emerges from the mold (the vertical direct chill casting process).

In the case of casting of Al and Al alloy, such as Al 0.5% Cu ingots, the ingot is saw cut into the desired target blank size. Then it is pressed and rolled. The blank is then machined, bonding of the target to an Al 6061 backing plate may preferably be conducted as reported in patent applications WO 00/15863 and PCT/US00/18968 filed Jul. 12, 2000. The bonded target/backing plate assembly is then ready for usage in conventional cathodic sputter coating operations preferably those adapted for sputter coating of flat panel displays.

The sputter targets made in accordance with the above process have exhibited reduction in macroparticle generation particularly in high power systems such as those sputter systems employed to coat thin layers on flat panel displays. Such systems commonly operate at high power densities of about 25 W/cm$^2$ and greater and, in the past have been plagued by poor sputtering uniformity due to macroparticle generation during sputtering.

For example, Al and Al targets made by the above process and containing reduced inclusion levels can be used in sputtering processes to form an Al layer in flat panels of the type described in U.S. Pat. No. 6,019,657. As is typical in such structures, the sputter coated Al layer is then coated with a cladding layer such as would be formed with Mo, W, Ti, Nb, Ni, Cr, metal silicide etc. The flat panel displays are used in liquid crystal, electro-luminescent, gas plasma and vacuum fluorescent displays.

The Al targets are sputtered using conventionally available sputtering equipment of the type functioning to coat large flat panel displays. In such systems, the target is attached to the cathode and a power density of at least 25 W/cm$^2$ is imparted to the system, resulting in ionic bombardment of the target from the charged plasma cloud in the apparatus above the target. The ionic bombardment of the target dislodges the desired coating material from the target surface and this material is deposited on the flat panel positioned proximate the anode.

In order to test the targets manufactured by the above process to ensure that inclusion content is reduced, an ultrasonic scanning method is preferably used. Equipment and methods necessary to scan for target inclusions can be seen in U.S. Pat. No. 5,406,850 of common assignment herewith. This disclosure is incorporated by reference herein.

In accordance with the test, target inclusions seen by the scanning process are compared against calibration values. If inclusions are too large, the target is rejected. Scanning can be conducted in both the "race track" and remaining portion of the sputter surface. It is presently preferred to reject targets wherein inclusions of greater than 400 μm are noticed in the "race track." Inclusions of less than 800 μm may be tolerated in the remaining non-race track areas.

Another non-destructive method for characterizing a sputter target material and comprises the steps of sequentially irradiating a test sample of the sputter target material with sonic energy at a plurality irradiating on a surface of the sample; detecting echoes induced by the sonic energy; discriminating texture-related back scattering noise from the echoes to obtain non-rectified radio frequency echo waveform signals; monitoring non-rectified echo waveform signals for the 180° waveform phase inversion, comparing the non-rectified echo waveform signals with said at least one of each: phase inverting and phase non-inverting calibration values, to detect void-like and particle-like flaw data points separately and no-flaw data points; counting the flaw data points for the each flaw type separately as well as all together to determine a total flaw count $C_{FT\ (without\ phase\ inversion)}$; counting the flaw data points and the no-flaw data points to determine a total number of data points $C_{DP}$; and calculating a total cleanliness factor $F_{CT}=(C_{FT}/C_{DP})\times 10^6$ as well as cleanliness factors $F_{CI}=(C_{FI}/C_{DP})\times 10^6$ and $F_C=(C_{FN}/C_{DP})\times 10^6$ for each sort of flaws separately. Cleanliness factor $C_{FI}$ represents phase inverted flaws such as voids contained in the metal. $C_{FN}$ represents non-phase inverted flaws such as inclusions in the metal.

Unlike many prior art methods, this test method provides a characterization of the sputter target material by separate identification of and counting of void-like and particle-like (i.e., inclusion) flaws. A partition of cleanliness factor for components associated with different kinds of flaws defines the rejection criteria more precisely by identifying and sizing the flaws of different kind.

Although the cleanliness factor provides a useful characterization of the sputter target material, quality control information can also be provided by means of a histogram. More specifically, the sputter target may be characterized by defining a plurality of amplitude bands for each type (waveform inverting and non-inverting) of flaws; measuring said modified amplitude signals to determine modified amplitude signal magnitudes; comparing said modified amplitude signal magnitudes with said plurality of amplitude bands to form subsets of said modified amplitude signals; counting said subsets of modified amplitude signals to determine a plurality of modified amplitude signal counts, each modified amplitude signal count of said plurality of amplitude signal counts corresponding to one of said amplitude bands of said plurality of amplitude bands; and constructing a pareto histogram, combining individual histograms for both flaw classes, relating said modified signals counts to said plurality of amplitude bands.

These methods for characterizing sputter target materials may be used in processes for manufacturing sputter targets. The cleanliness of a sputter target and particularly cleanliness from non-phase inverting flaws is the primary factor determining the quality of layers or films produced by the target. By shaping only those sputter target blanks having cleanliness factors or histograms meeting certain reference criteria to form sputter targets, and rejecting blanks not meeting those criteria, one improves the likelihood that the sputter targets so manufactured will produce high quality layers or films.

Figure 5:
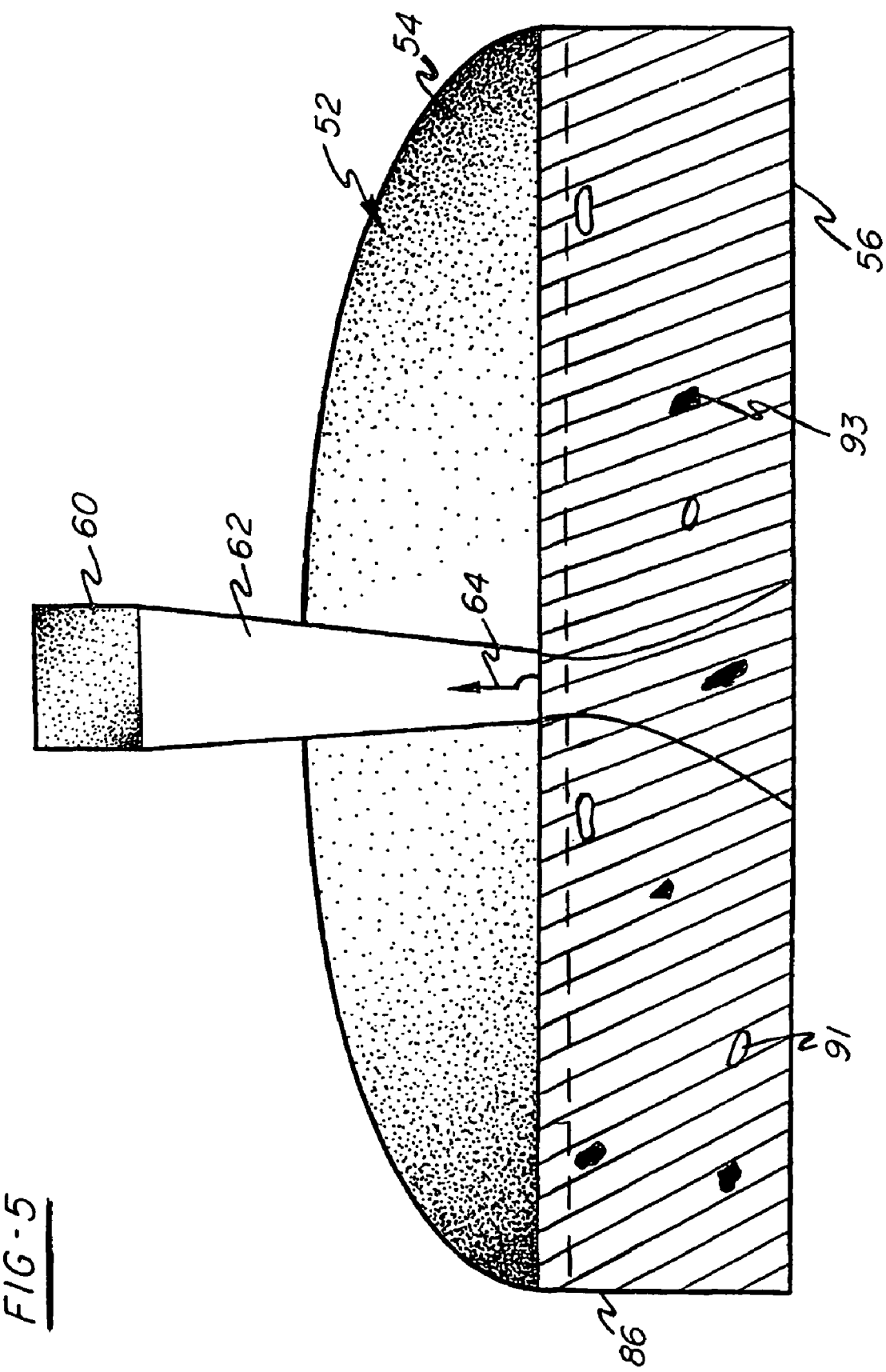
FIG. 5 is a schematic diagram illustrating a preferred method for assessing target "cleanliness" in accordance with the invention.

FIG. 5 illustrates one method for sorting of flaws and characterizing the cleanliness of sputter target material. In accordance with this method, a cylindrical sample of the sputter target material (which preferably comprises metal or a metal alloy) is compressed or worked to produce a disc-shaped test sample 52 having a planar upper surface 54 and a planar lower surface 56 approximately parallel to the upper surface 54. The transducer 60 irradiates the upper surface 54 of the test sample 52 with a single, short-duration, megahertz frequency range ultrasonic pulse 62. The transducer 60 subsequently detects an echo 64 induced in the test sample 52 by the pulse 62. The transducer 60 converts the echo into an electrical radio frequency signal (not shown), which is processed to retrieve the waveform phase and maximum amplitude information.

More specifically, the sample first is compressed along a dimension to form the disc-shaped test sample 52. Preferable, the sample is compressed by forging or rolling, followed by diamond cutting to prepare the planar surfaces 54 and 56. The reduction in the dimension may be anywhere between 0% to 100%. The compression of the sample flattens and widens certain flaws. The target comprises both void-like defects 91 and inclusions or undesirable particles 93.

Figure 6:
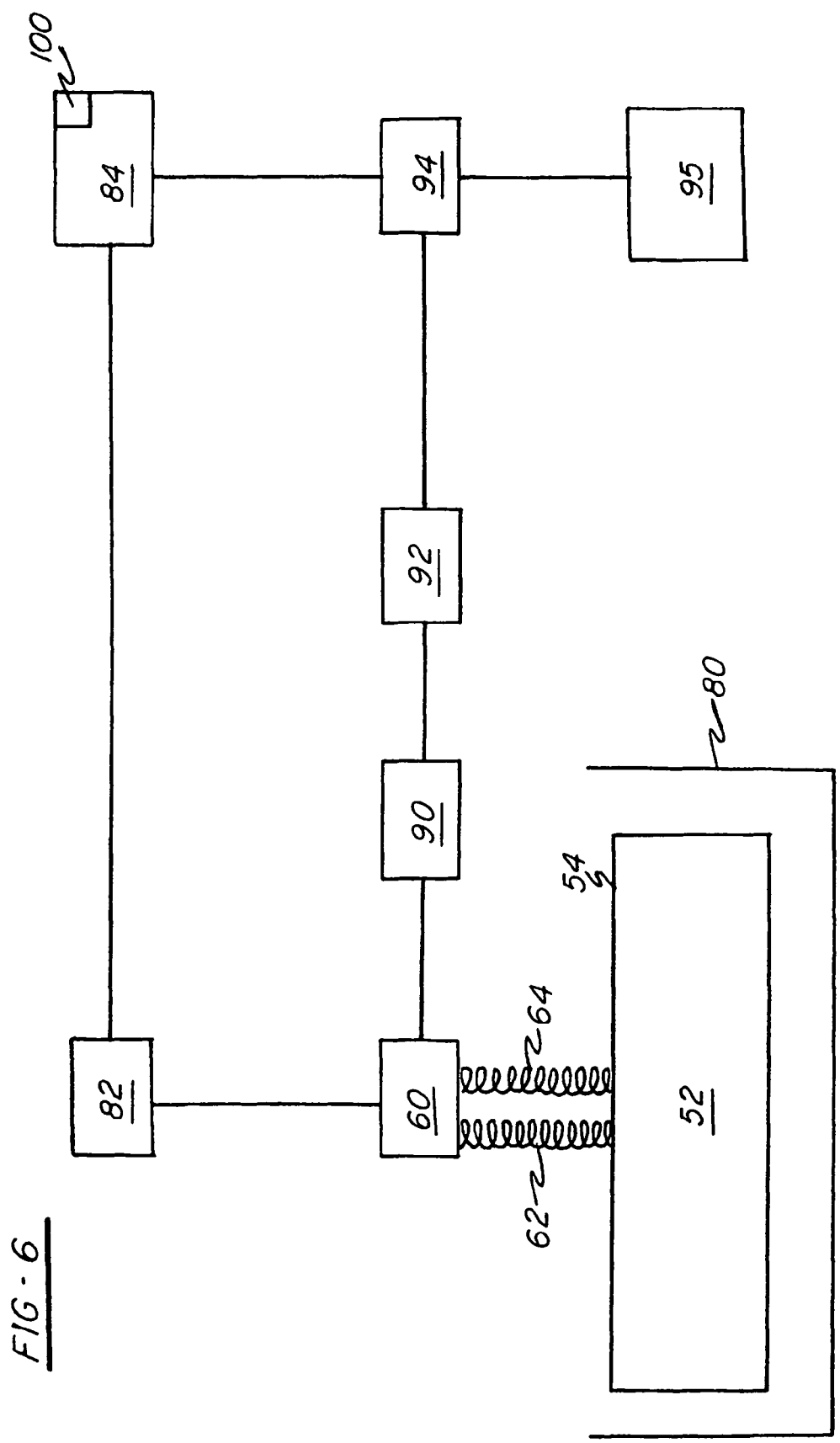
FIG. 6 is a schematic block form illustration of a test system for assessing the "cleanliness" of targets.

As illustrated in FIG. 6, the test sample 52 then is immersed in deionized water (not shown) in a conventional immersion tank 80. The transducer 60 is mounted on a mechanical X-Y scanner 82 in electrical communication with a controller 84 such as a PC controller. The controller 84 is programmed in a conventional manner to induce the mechanical X-Y scanning unit 82 to move the transducer 60 in a raster-like stepwise motion across the upper surface 54 of the test sample 52.

The transducer 60 is sold by ULTRAN USA under the designation WS50-10P4.5. This is a long focal length piezoelectric transducer having a fixed focal length of 114 mm (in water). At a peak frequency of approximately 9.15 MHz with 8 MHz (−6 dB) bandwidth, the transducer produces a pulse 62 having a focal zone (−6 dB) of approximately 21 mm in aluminum and a focal spot 0.8-0.9 mm in diameter.

Most preferably, the upper surface 54 of the sample 52 has a width or diameter on the order of approximately 28 cm. Data acquisition steps of approximately 0.9 mm in both the "x"-direction and the "y"-directions permit the detection of 0.25 mm flat bottom holes at a detection level of −6 dB without exposure area overlap. One thereby irradiates approximately 100,000 test points on the upper surface 54.

Most preferably, the transducer 60 is oriented so that the pulse 62 propagates through the deionized water (not shown) in the immersion tank 80 and strikes the test sample 52 approximately normally to the upper surface 54. Furthermore, the transducer 60 is preferably spaced from the upper surface 54 such that the pulse 62 is focused on a zone 86 (FIG. 5) of the test sample 52 between approximately 3 mm and 23 mm below the upper surface 54. The pulse 62 interacts with the sample 52 to induce echoes 64, which then propagate back through the deionized water (not shown) to the transducer 60 approximately 60 μsec after the pulse is sent.

An especially preferred echo acquisition system includes a low noise receiver comprising a low noise gated preamplifier 90; a low noise linear amplifier 92 with a set of calibrated attenuators, a 12-bit (2.44 mV/bit) analog-to-digital converter 94 and digital oscilloscope 95 connected with receiver analog output. When sufficient time has elapsed for the echoes to arrive at the transducer 60, the controller 84 switches the transducer 60 from a transmitting mode to a gated electronic receiving mode. The echoes 64 are received by the transducer 60 and converted into an RF electric signal (not shown). The RF signal is amplified by the preamplifier 90 and by the low noise amplifier 92 to produce modified amplitude signal and displayed on the screen of oscilloscope 95 to extract waveform phase information. The modified amplitude signal then is digitized by the analog-to-digital converter 94 before moving on to the controller 84. The analog-to-digital conversion is performed so as to preserve amplitude information from the analog modified amplitude signal.

Flaws of given nature (void-like or alumina inclusions) are determined by monitoring for waveform phase inversion using digital oscilloscope 95. Flaws of given sizes are detected by comparing the digitized modified amplitude signals obtained from the sample 52 with reference values derived from tests conducted on reference samples (not shown) having composition similar to that of the test sample 10 and either blind, flat-bottomed hole of fixed depth and diameter or alumina particles of given size artificially imbedded into reference sample material.

The especially-preferred PC controller 84 controls the data acquisition process. An especially-preferred software package used in connection with the data acquisition system is available from Structural Diagnostics, Inc. under the designation SDI-5311 Winscan.

The PC controller 84 is also programmed to calculate the total cleanliness factor and the cleanliness factors for the sorted flaws characterizing the material of the sample 52. More precisely, it is programmed to discriminate texture-related back scattering noise and to distinguish "void-like flaw data points from the alumina particle-like flaw data points". The PC controller 84 maintains a count of the flaw data points detected during the testing of a test sample 52 to determine a flaw count "$C_{FT}$", "$C_{FI}$", "$C_{FN}$".

The PC controller 84 also is programmed to distinguish "no-flaw data points," that is, digitized modified amplitude signals representing amplitudes which, after comparison with the calibration values, indicate the absence of flaws.

The PC controller also determines a total number of data points "$C_{DP}$," that is, the sum of the flaw count $C_{FT}$ and the number of no-flaw data points. Although the total number of data points could be determined by maintaining counts of the flaw data points and the no-flaw data points, it is preferably determined by counting the total number of positions "$C_I$" along the upper surface 54 at which the test sample 52 is irradiated by the transducer 60 and subtracting the number of digitized RF signals "$C_N$" which the data acquisition circuitry was unable, due to noise or other causes, to identify as either flaw data points or no-flaw data points. (Alternatively, the "noise count" $C_N$ may be described as the number of positions along the upper surface 54 at which neither a flaw data point nor a no-flaw data point is detected).

Having determined the flaw counts $C_{FT}$, $C_{FI}$, $C_{FN}$, and the total number of data points $C_{DP}$, the PC controller is programmed to calculate the cleanliness factor $F_{CT}=(C_{FT}/C_{DP})\times 10^6$, $F_{CI}=(C_{FI}/C_{DP})\times 10^6$, $F_{CN}=(C_{FN}/C_{DP})\times 10^6$ to characterize the material comprising the sample 52. Unlike the prior art "flaws per cubic centimeter," the magnitude of the cleanliness factor is not dependent on any estimate of pulse cross-sectional area. Since the cleanliness factor is normalized by the dimensionless coefficient $C_{DP}\times 10^{-6}$ rather than by volume, it is more closely related to ppm and ppb units than are units of "flaws per cubic centimeter."

The preparation of a suitable program for determining the cleanliness factor in accordance with the invention as disclosed herein is within the ordinary skill in the art and requires no undue experimentation.

Another way in which to characterize the material comprising the sample 52 is by determining the size distribution of flaws in the test sample 52. More specifically, one may characterize the cleanliness of the sample 52 by defining amplitude bands or ranges; comparing the amplitudes represented by the digitized modified amplitude signal for certain types of flaws (phase inverting and phase non-inverting) with the amplitude bands to form subsets of the modified amplitude signals; counting these subsets of modified amplitude band and for each type of flaws; and constructing a pareto histogram relating the modified signal counts to said plurality of amplitude bands. Since the amplitudes represented by the digitized modified amplitude signals for each type of flaws are related to the sizes of flaws detected in the sample 52, the histogram provides and indication of the flaw size distribution in the sample 52.

The preparation of a suitable program for plotting histograms herein is within the ordinary skill in the art and requires no undue experimentation.

Either the cleanliness factor or histograms may be used as a product quality test. As noted earlier, the cleanliness of a sputter target is one factor determining the quality of the layers or films produced by the target. By shaping only those sputter target blanks having cleanliness factors and particularly $C_{FN}$ less than reference cleanliness factors, or having histograms with selected columns or areas less than reference values, to form sputter targets, and rejecting blanks not meeting those criteria, one improves the likelihood that the sputter targets so manufactured will produce high quality layers or films.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A method of making an aluminum or aluminum alloy sputter target adapted for sputtering of a flat panel display comprising:
   (a) determining a power density at which said flat panel display will be sputtered;
   (b) correlating said determined power density from said step (a) to a threshold value for deleterious sputter target inclusion sizes;
   (c) providing molten Al or Al alloy;
   (d) adding to said molten Al or Al alloy an amount of between about 0.01-2.00 wt % Si and from about 0.01-3.00 wt % Cu to form a molten alloy mixture;
   (e) forwarding said molten alloy mixture through a filter and choosing a filter grit size of between about 2 to about 14 to filter from said molten alloy inclusions having sizes greater to or equal to said threshold value; and
   (f) allowing said filtered alloy to solidify and forming said target; whereby said target is substantially free of inclusions having sizes greater to or equal to said threshold value.

2. A method as recited in claim 1 wherein said power density at which said flat panel display will be sputtered is determined to be about 25 W/cm$^2$ and said correlated threshold value is about 400 μm; said method further comprising choosing a filter grit size of about 8.

3. A method as recited in claim 2 wherein said power density at which said flat panel display will be sputtered is determined to be 40 W/cm$^2$ or greater and said correlated threshold value is 300 μm.

4. A method as recited in claim 1 wherein said filter element is a ceramic filter.

5. A method as recited in claim 1 wherein said molten alloy mixture is Al 0.5 Cu 0.5 Si.

* * * * *